United States Patent
Marten et al.

(10) Patent No.: US 6,239,644 B1
(45) Date of Patent: May 29, 2001

(54) CLOCK STRETCHER AND LEVEL SHIFTER WITH SMALL COMPONENT COUNT AND LOW POWER CONSUMPTION

(75) Inventors: Victor Marten, Flushing; Ioannis Milios, New York; Wei Wang, Forest Hills, all of NY (US)

(73) Assignee: USAR Systems, Inc., New York, NY (US)

( * ) Notice: Subject to any disclaimer, the term of this patent is extended or adjusted under 35 U.S.C. 154(b) by 0 days.

(21) Appl. No.: 09/445,191

(22) PCT Filed: Jul. 9, 1998

(86) PCT No.: PCT/US98/14325

§ 371 Date: Mar. 15, 2000

§ 102(e) Date: Mar. 15, 2000

(87) PCT Pub. No.: WO99/03042

PCT Pub. Date: Jan. 21, 1999

Related U.S. Application Data

(60) Provisional application No. 60/051,980, filed on Jul. 9, 1997.

(51) Int. Cl.[7] .......................................................... H03L 5/00
(52) U.S. Cl. ............................ 327/333; 327/141; 327/299
(58) Field of Search ................................ 327/99, 141, 144, 327/291, 293, 294, 298, 299, 408, 409, 333, 374, 382, 427, 437; 326/63, 80, 85, 87

(56) References Cited

U.S. PATENT DOCUMENTS

| | | | |
|---|---|---|---|
| 4,598,216 | * 7/1986 | Lauffer et al. | 326/17 |
| 5,371,880 | * 12/1994 | Bhattacharya | 395/550 |
| 5,594,874 | * 1/1997 | Narayanan et al. | 395/284 |
| 5,844,438 | * 12/1998 | Lee | 327/99 |
| 5,877,636 | * 3/1999 | Truong et al. | 327/99 |

* cited by examiner

Primary Examiner—Kenneth B. Wells
Assistant Examiner—An T. Luu
(74) Attorney, Agent, or Firm—Oppendahl & Larson LLP

(57) ABSTRACT

A clock stretching circuit (110) mites between a synchronous bus (112) and a microcontroller (124) which is asleep most of the time to save electrical power. The bus is of a type in which a slow bus device can cause the sender of data to "hold" the data until the slow device is up to speed. The stretching circuit (110) is of small component count and low power consumption, and there is no requirement for a continuous clock. In one embodiment is comprised of a triple analog switch (120, 121, 122) and a very small number of additional components. In another embodiment a dual four-position multiplexer (162, 163) is employed. In still another embodiment, four transistors (210, 212, 213, 215) are used with handful of additional components. A level shifter (220, 221, 222, 223) including an MOSFET and a large-value resistor help to minimize power drain within the bus device. The components can be external to an off-the-shelf microcontroller or can be included in an IC that also contains an embedded microcontroller.

12 Claims, 8 Drawing Sheets

CLOCK STRETCHER AND LEVEL SHIFTER WITH SMALL COMPONENT COUNT AND LOW POWER CONSUMPTION

This application claims priority from copending U.S. provisional patent application No. 60/051,980, filed Jul. 9, 1997, entitled Clock stretching and level shifting circuit, which application is hereby incorporated by reference.

The invention relates generally to an interface for a two-wire synchronous data communications bus, and relates more specifically to a interface to such a bus having a protocol in which any bus device can hold the data state by holding the clock line in a predetermined state, and in which the interface has small component count and low power consumption. The circuit also provides level shifting to minimize power consumption.

BACKGROUND

The microcomputer revolution began two decades ago, but for most of that time it was required only that the system being designed comply with rather unforgiving requirements of size (on the order of a desktop) and power consumption (several dozens or hundreds of watts). The early personal computers used large numbers of discrete components, but thereafter it became commonplace to use "chip sets" which reduce the computer system to half a dozen integrated circuits each with dozens or hundreds of pins, or preassembled "mother boards", either of which leaves little or no room for optimization by the individual system designer. Thus the individual designer cannot do much in the way of reducing power consumption or changing physical size or form factor.

In more recent years, however, the marketplace has come to demand computer systems, such as personal computer systems, which run independently of AC (mains) power and which are meant to be carried from place to place and used in portable fashion. In such systems there is a renewed attention to issues of power consumption, weight, and size. One consequence of the greater attention to power consumption is the development of communications channels and protocols according to which system elements which provide and consume power are in communication with each other to permit sophisticated power management. It is desirable that the power management communications channel and protocol satisfy several requirements, for example, small pin count (so that batteries need not have too many connector pins) and undemanding protocols (so that devices can be slow if necessary). One approach is to employ a synchronous bus, that is, a bus in which data is passed with reference to a clock line. The clock line is "high" in a quiescent state, and is pulled low if a device on the bus (the "bus master") wishes to pass a bit of data on the line for reading by any or all of the devices on the bus. At a later time, the bus master raises the clock line and again pulls the line low to indicate that a subsequent bit of data is readable by any or all of the devices on the bus. In this way a message composed of many data bits is communicated across the bus.

To accommodate a range of types of bus devices with varying response times and latencies, it is desirable to define a "clock stretching" element of the protocol. According to this aspect of the protocol, any bus device, having noted that the clock line has been pulled low, can itself pull the clock line low. Indeed in the general case it is assumed that any number of bus devices may have done so. During the time that the clock line remains low, the defined behavior of the bus master is to maintain the data level on the data line. In this way, a bus device can take as long as desired to read the data value (and to prepare for the reading of subsequent data values). In colloquial terms, it can be said that the clock line remains low until the slowest of the bus devices has managed to get up to speed and to process data on the data line.

Those skilled in the art will appreciate that power consumption in a microprocessor or microcontroller is monotonically (and generally linearly) related to the clock speed thereof. Thus the system designer who is attempting to maximize battery life (or to minimize power consumption) will consider a variety of measures including switching a microcontroller to a very slow clock speed, or indeed powering down the microcontroller, during times of low or zero workload. (This may be termed "putting the controller to sleep".) For example the designer of a microcontroller for a computer keyboard may actually power down the microcontroller except when a key has been pressed. If the user makes a thousand keystrokes, the microcontroller is powered up and down a thousand times.

Returning now to the above-mentioned synchronous bus with clock stretching, it may happen that the system designer chooses to have a bus device go to sleep, only to be awakened when there is activity on the bus. But a block of data transmitted on the bus may be intended for the very device that is asleep, and yet it is desired that no data be lost. The "clock stretching" aspect of the protocol may be employed to prevent such data loss. The circuitry that accomplishes the "clock stretching" cannot itself be put to sleep, of course, but must be kept functioning at all times in case data is transmitted on the bus. The clock stretching circuit cannot have any clocks running continuously. In at least one known prior art design, it is necessary that the clock stretching circuitry be served by a clock that runs continuously, at a megahertz or so. This leads to non-negligible power consumption.

A further concern is that there be minimal power leakage into any particular bus device while it is asleep.

FIG. 10 shows a typical prior art circuit that permits microcontroller 8051SL to go to sleep if desired and includes a clock stretching function. Four flip-flops ("start det", "clk hold", "busy", and "stop") are required along with several logic gates and comparators. There are many components to be assembled during manufacture and they take up space and consume power.

It would be extremely desirable to provide a "clock stretching" circuit that would permit putting a microcontroller to sleep so as to save power, such a circuit having substantially smaller component count, power consumption, and assembly cost. It would be additionally desirable to provide a level shifting circuit that isolates the bus device from the bus when the bus device is in a power saving mode, has its power removed, or is operating at a power supply voltage lower than that of the bus itself.

SUMMARY OF THE INVENTION

A clock stretching circuit mediates between a synchronous bus and a microcontroller which is asleep most of the time to save electrical power. The bus is of a type in which a slow bus device can cause the sender of data to "hold" the data until the slow device is up to speed. The stretching circuit is of small component count and low power consumption and does not require any clocks. In one embodiment is comprised of a triple analog switch and a very small number of additional components. In another embodiment a dual four-position multiplexer is employed. In still another embodiment, four transistors are used with a handful of additional components. A level shifter including an MOSFET and a large-value resistor help to minimize power drain within the bus device. The components can be external to an off-the-shelf microcontroller or can be included in an IC that also contains an embedded microcontroller.

DESCRIPTION OF THE DRAWING

The invention will be described with respect to a drawing in several figures, of which.

Where possible, like reference designations have been applied to like elements.

DETAILED DESCRIPTION

Figure 1:
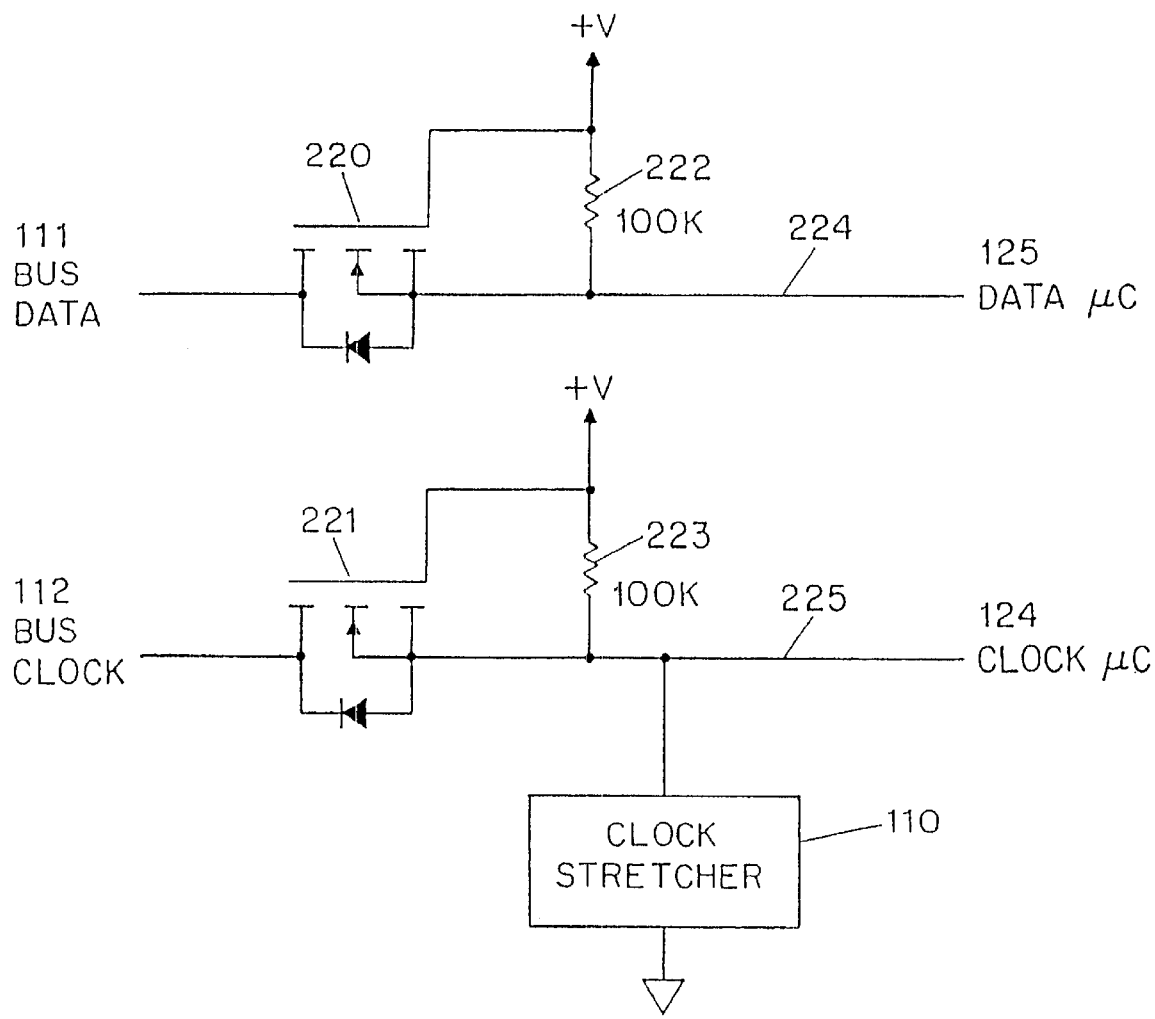
FIG. 1 shows in functional block diagram form a generalized system including a synchronous communications bus, a microcontroller, and a clock stretching circuit, together with a power-saving level shifter.

FIG. 1 shows in functional block diagram form a generalized system including a synchronous communications bus, a microcontroller (at 125, 124), and a clock stretching circuit 110, together with a power-saving level shifter (generally, 220, 221, 222, 223). The purpose of the level shifters is to convert 0 to 5 signal swings on the bus into 0 to V+ swings on the microcontroller (bus device) pins 125, 124 (for the V+ in the range of 2.7 to 3.3 volts) and to limit the leakage into the bus clock and bus data contacts 111, 112 while the bus device is in total power-down (V+ is removed or at ground potential).

The circuit for each of the bus clock and bus data lines I 1, 112 consists of a single N-channel enhancement-mode MOSFET 220, 221 (with $V_{GS(th)}$<1.5 volts), and a single resistor 222, 223, preferably a high-value pullup resistor (~100KΩ). Operations of the level shifters for the clock and the data lines are the same, and the clock line 112 will be described.

In the idle state (the bus clock line being high), both the Gate and Source of the MOSFET 221 are at the same potential (V+), $V_{GS}$=0 V, so that the transistor 221 is fully off (the channel is completely depleted). The drain is at the same (V+) or higher voltage. The intrinsic (parasitic) diode in the MOSFET structure is reverse-biased and does not conduct current.

When an external device (device external to the bus device depicted herein) drives the bus clock line 112 low, the intrinsic diode starts to conduct and initially develops a ~0.6 V drop from the drain to the source. The clock line 225 connected to the microcontroller (bus device) which is connected to the source of the MOSFET 221 follows the input voltage on the bus clock line 112 (but is higher by the ~0.6 V drop across the diode). The MOSFET 221 starts to develop enhancement voltage between the gate and source terminals.

When the input voltage reaches the level of $[(V+)-(V_{GS(th)}+V_{diode})]$, the MOSFET 221 begins to conduct current. As more current passes through the MOSFET 221, the potential of the source is driven to the level of the bus clock line 112 on the drain. The process is regenerative and action is similar to a Schmitt trigger with ~0.6 V hysteresis. As the input bus clock line 112 level increases further, the MOSFET turns fully on, and brings the potential of the source 225 close to the level of the bus clock line 112 on the drain.

At V+=2.7 V the input voltage on the drain should be less than ~0.6 V in order to activate the MOSFET 221 (with $V_{GS(th)}$<1.5 V).

On the positive edge of the bus clock line 112 swing, the microcontroller's clock input line 225 follows the bus clock line 112 exactly until the level of $[(V+)-(V_{GS(th)})]$, when the MOSFET 221 turns off, and the microcontroller's clock input line 225 starts to follow the bus clock line 112 with a positive offset of $V_{diode}$.

The pullup resistors 222, 223 absorb small leakage currents from the MOSFETs 220, 221, the microcontroller and any additional circuitry connected to the translated/shifted clock and data lines 224, 225.

Figure 2:
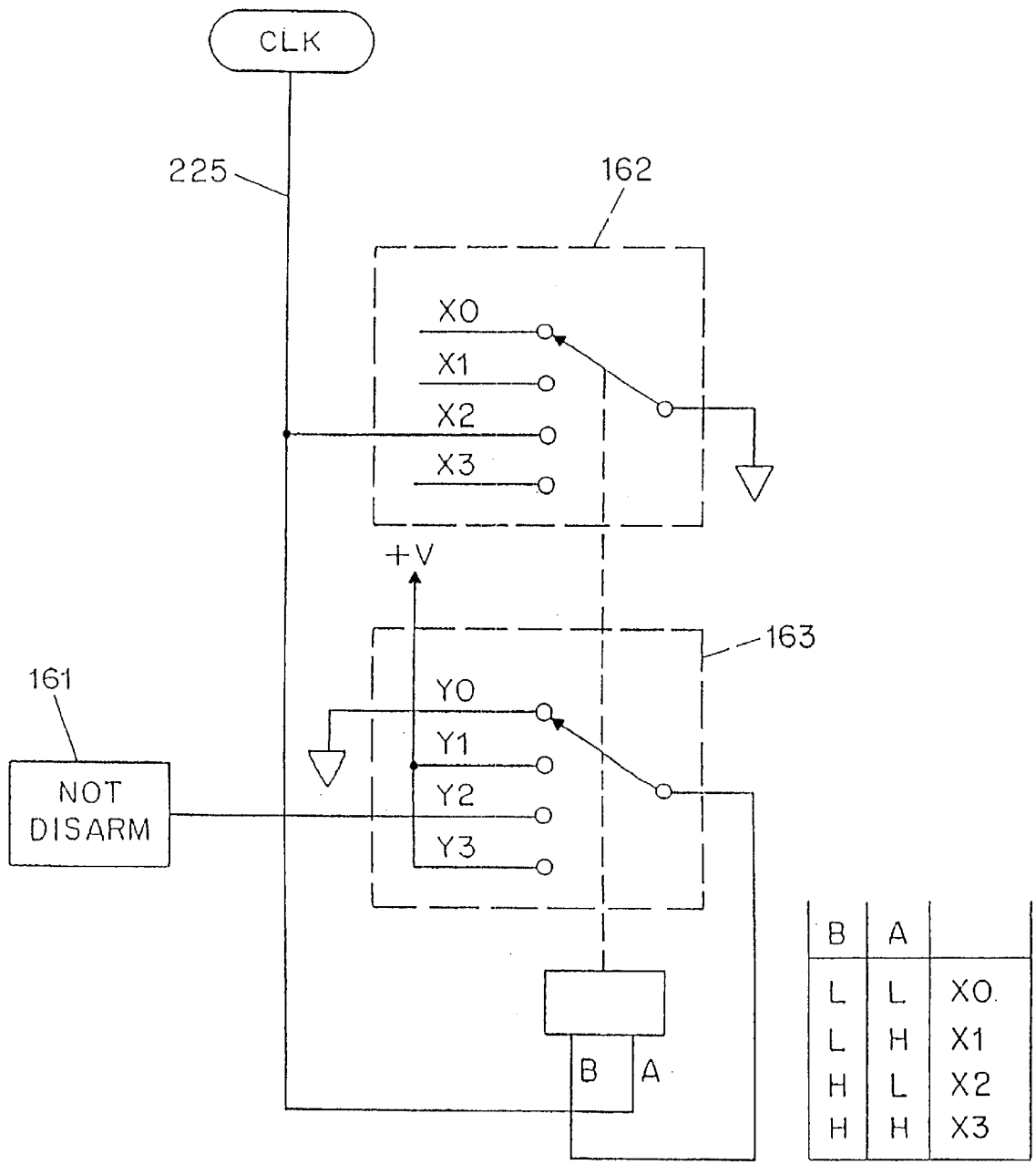
FIG. 2 shows in schematic form a clock stretching circuit employing a dual four-way multiplexer.

FIG. 2 shows in schematic form a clock stretching circuit (110, FIG. 1) employing a dual four-way multiplexer 162, 163 preferably part number 74HC4052. The shifted clock line 225 connects with pin X2 of multiplexer 162, the common terminal of which is grounded. It also serves as one of the two binary inputs B, A which control the selections of the multiplexers 162, 163. As shown in the truth table, a binary count across binary values of B and A results in selection of selection lines 0 through 3.

What is shown is a portion of a synchronous bus having a clock line 225 with a first quiescent level (typically a positive voltage) and a second active level (ground) and a data line (omitted for clarity in FIG. 2), and with a bus device (also omitted for clarity in FIG. 2) having higher and lower power-consuming states; a clock stretcher (generally FIG. 2) comprising first and second four-position analog switches 162, 163, both of said switches controlled by a two-input binary control defining first and second inputs B and A. The clock line 225 comprises the first one of said binary inputs, an output X2 of the first analog switch 162 being open when said clock line 225 is at its first level and being at said second active level (grounded) when said first input A is at said second active level and said second input B is at a predetermined level; said output X2 of said first analog switch 162 connected with said clock line 225; said output X2 of said first analog switch 162 when at said second active level causing said bus device to transition from its lower-power-consuming-state to its higher-power-consuming state; said bus device further characterized in having a control output 161; said second four-position analog switch 163 characterized in that when said first input A is at said second active level and said second input B is at said predetermined level, said control output 161 is connected with said second input B.

In this arrangement the output causing the bus device to transition from its lower-power-consuming-state to its higher-power-consuming state is connected to said bus device via line 225, which is a different conductor from that of the control output 161 of the bus device.

Figure 3:
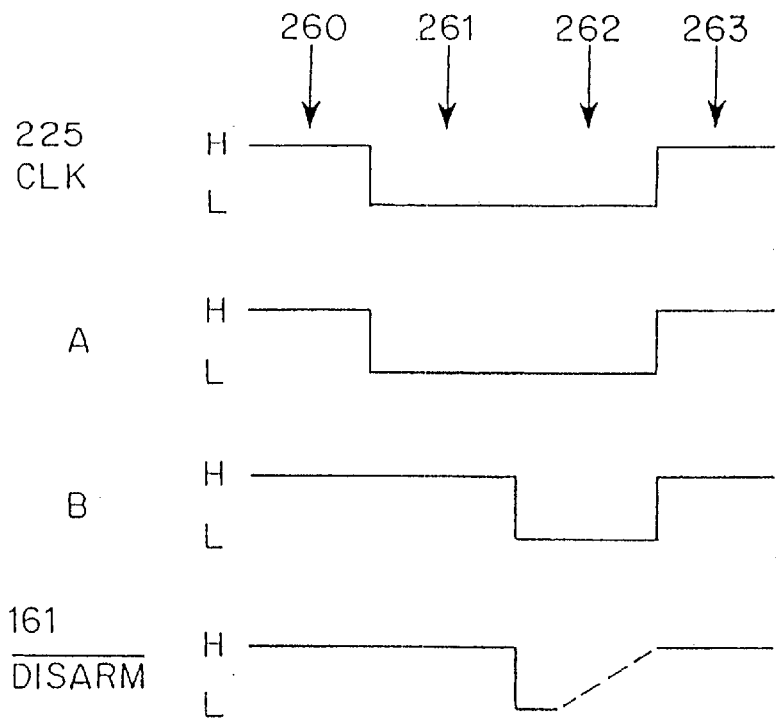
FIG. 3 shows a signal flow diagram for the circuit of FIG. 2.

FIG. 3 shows a signal flow diagram for the circuit of FIG. 2. The quiescent state 260 has the clock line high, and thus A is high. When some device on the bus asserts the clock line by pulling it low, state 261 is entered. After some time the microcontroller (bus device) is awakened from its low-power state and asserts (pulls low) the line 161. This causes line B to go low for state 262. At some later time the microcontroller de-asserts line 161 and the clock line is released. State 263 arrives, which is identical to state 260.

Figure 4:
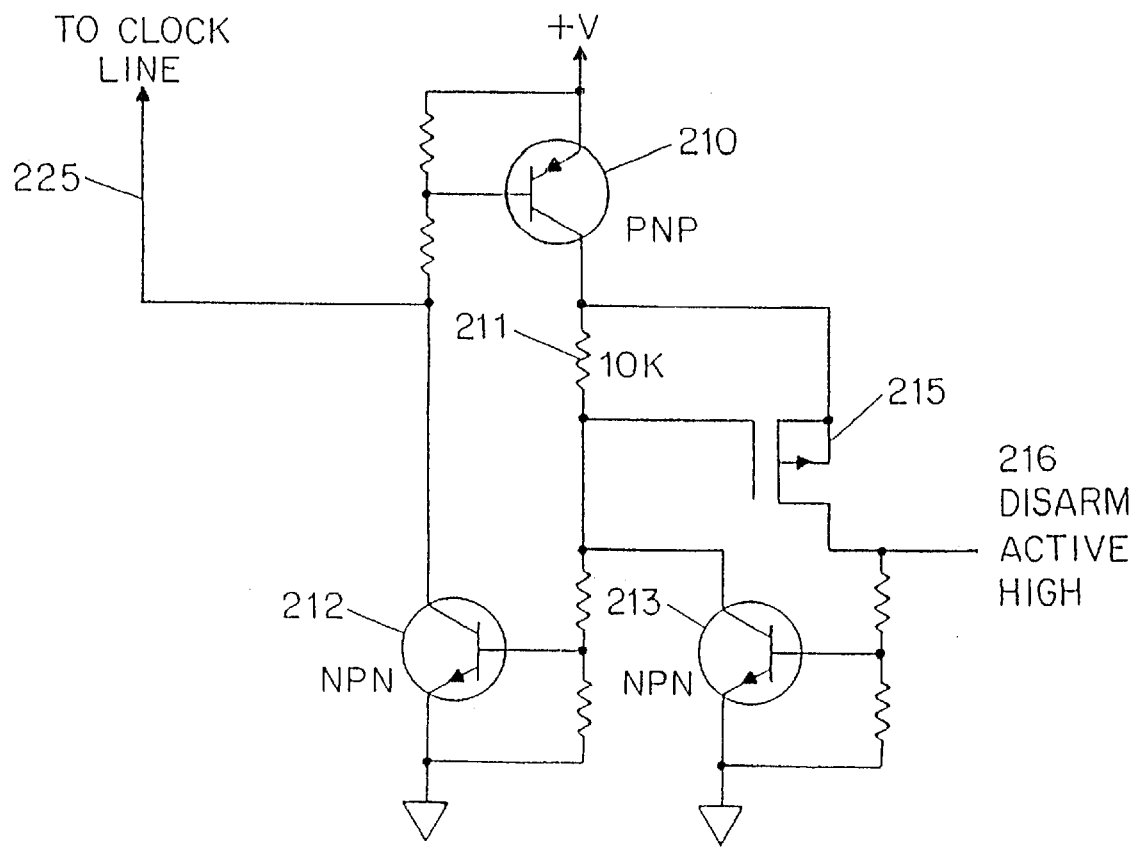
FIG. 4 shows in schematic form a clock stretching circuit employing an MOSFET and three bipolar transistors.

FIG. 4 shows in schematic form a clock stretching circuit (110, FIG. 1) employing an MOSFET 215 and three bipolar transistors 210, 212, 213. The FET is P-channel in this embodiment, transistors 212 and 213 are NPN, and transistor 210 is PNP.

In this arrangement the first and second transistors 210, 212 define a bistable gate having first and second states. The gate is electrically coupled with the clock line 225. When the clock line 225 is active low, this causes the gate to enter a state in which both transistors 210, 211 are turned on. This pulls the clock line 225 low (active) which means that it stays low even after the external bus master device has stopped pulling the line low.

The microcontroller (bus device) is responsive to the clock line entering its second active level (in this example, goes low) by entering said higher power-consuming state, and has a control output 216. The gate is responsive to the control output by turning off the two transistors, permitting the clock line 225 to go high.

Figure 5:
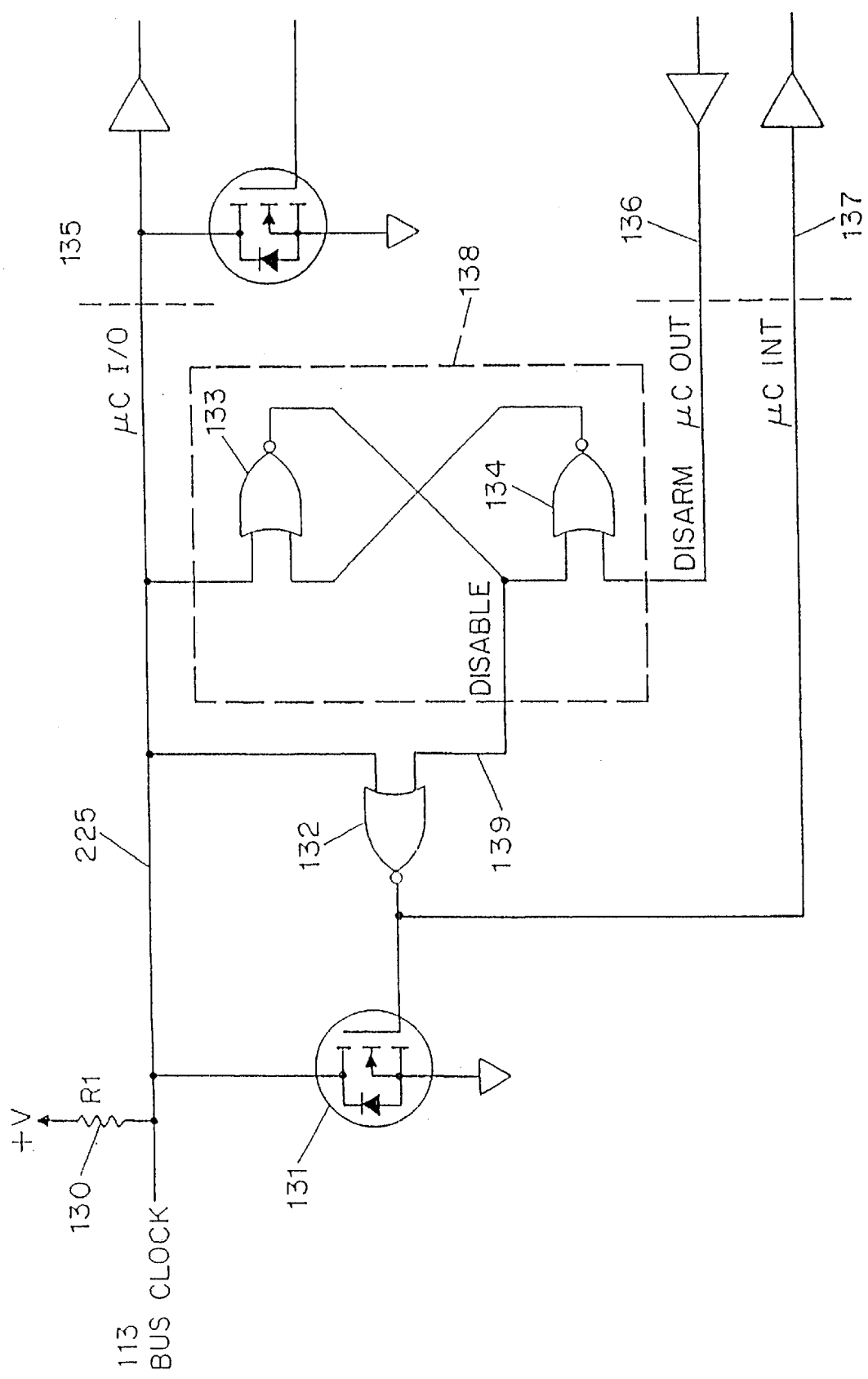
FIG. 5 shows in schematic form a clock stretching circuit employing an MOSFET and three logic gates.

FIG. 5 shows in schematic form a clock stretching circuit (110, FIG. 1) employing an MOSFET 131 and three logic gates 132, 133, 134. The gates 133, 134 make up a flip-flop 138.

In this arrangement the flip-flop 138 responds to the clock line 225 going low by entering a state in which line 139 causes gate 132 to cause transistor 131 to turn on. Transistor 131 when turned on draws said clock line 225 low (active).

At some time the microcontroller (bus device) is fully up to speed and is capable of responding to the fact of the clock line having gone low. It then asserts control line 136 which resets the flip-flop 138 and permits line 139 to allow the transistor 131 to turn off.

In this arrangement the signal interrupting the microprocessor to enter its higher-power-consuming state is line 137, driven by the output of gate 132. In this way, the signal interrupting the processor is connected with said bus device via a different conductor 137 from that of the control output 136 of the bus device.

Figure 6:
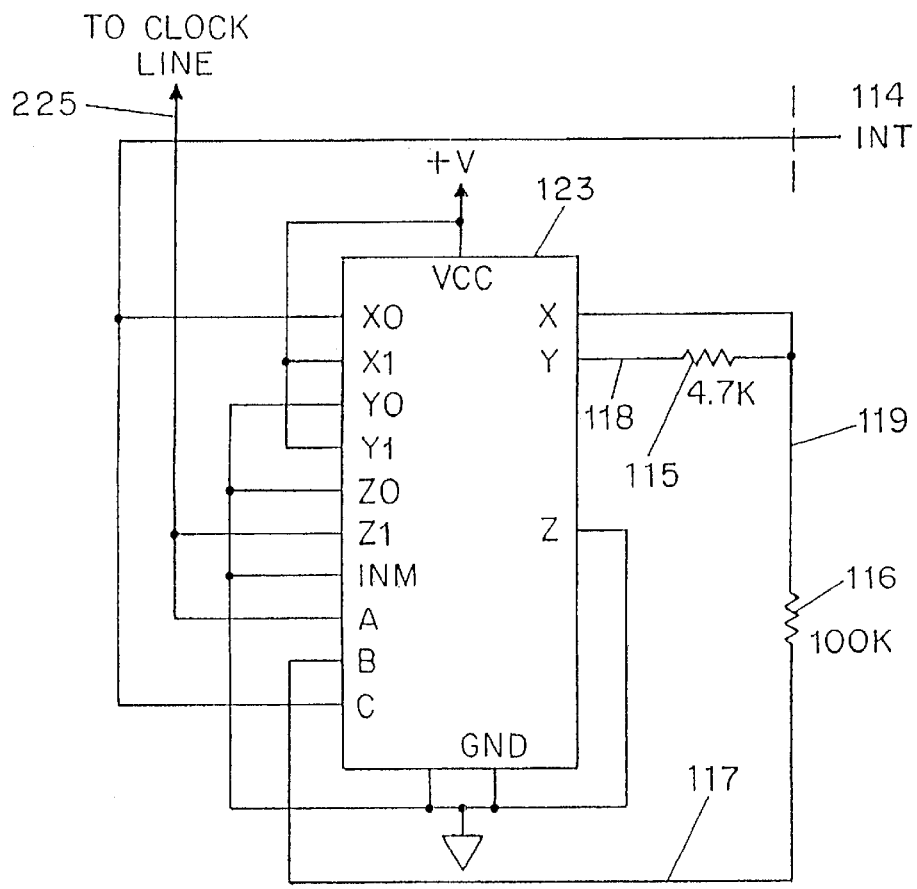
FIG. 6 shows in integrated circuit block diagram form a clock stretching circuit employing a triple analog switch.

FIG. 6 shows in integrated circuit block diagram form a clock stretching circuit (110, FIG. 1) employing a triple analog switch 123. It is shown in more detail in FIG. 7. Interrupt line 114 causes the microprocessor (bus device) to enter its high-power state. Switch 123 is preferably 74HC4053.

Figure 7:
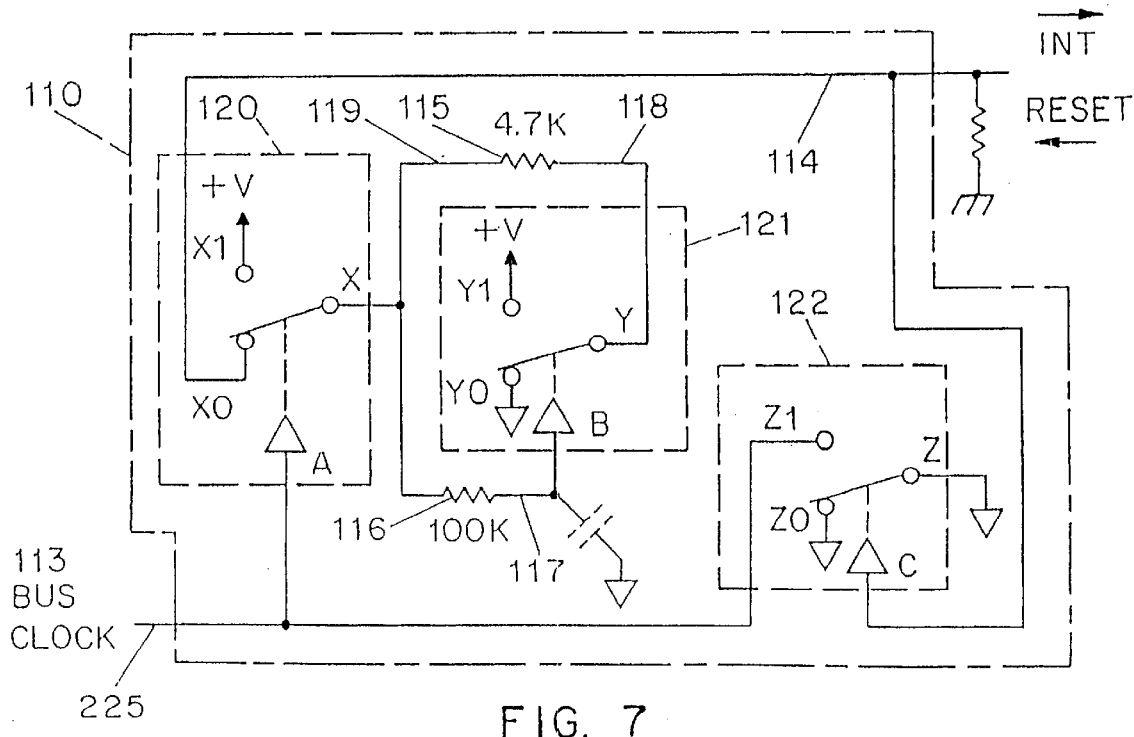
FIG. 7 shows in schematic form the circuit of FIG. 6.

FIG. 7 shows in schematic form the circuit of FIG. 6. As will be appreciated, when bus clock line 225 goes low (active), this turns off driver A and relaxing switch 120, permitting line 114 to go high and turning on driver C. This shorts line 225 to ground through switch 122. Line 114 is an interrupt to the microcontroller (bus device) and causes the microcontroller to enter its awake state. At such time as the microcontroller chooses to permit the data bus to proceed, it pulls line 114 low, turning off driver C and releasing the ground on line 225 Switch 121 together with external components provides a timing function.

Figure 8:
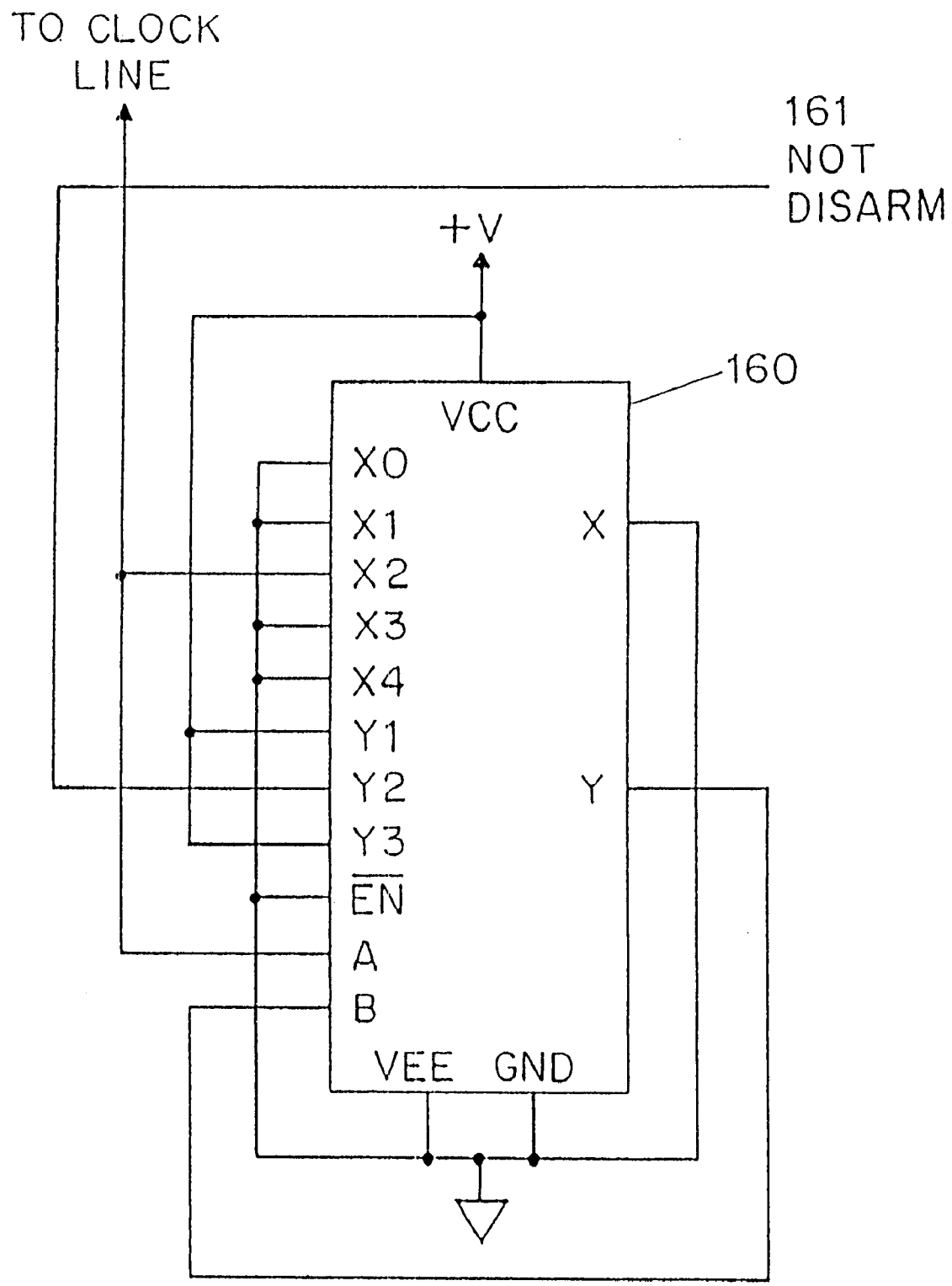
FIG. 8 shows in integrated circuit block diagram form the circuit of FIG. 2.

FIG. 8 shows in integrated circuit block diagram form the circuit of FIG. 2.

Figure 9:
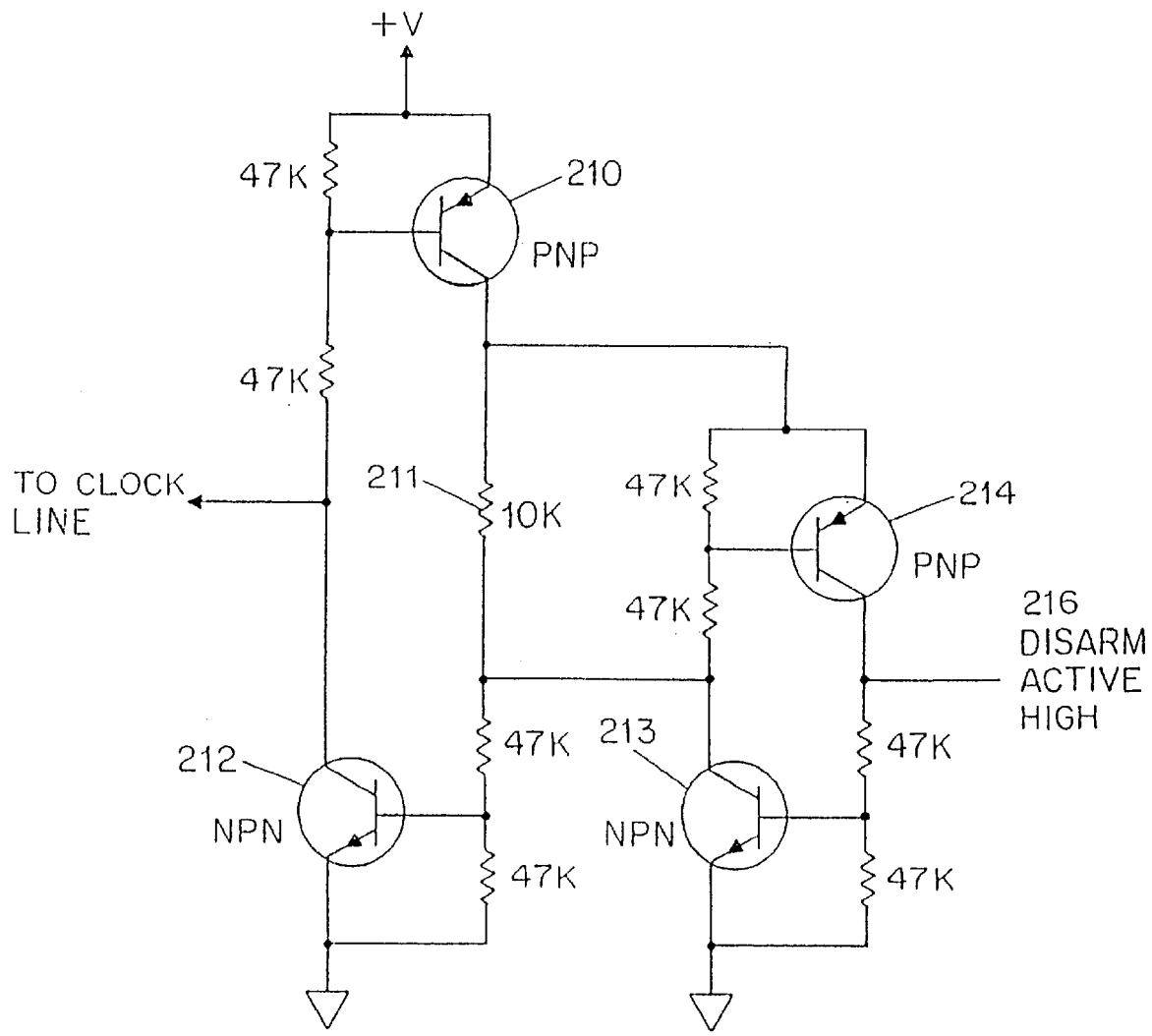
FIG. 9 shows in schematic form a clock stretching circuit employing four bipolar transistors.
Figure 10:
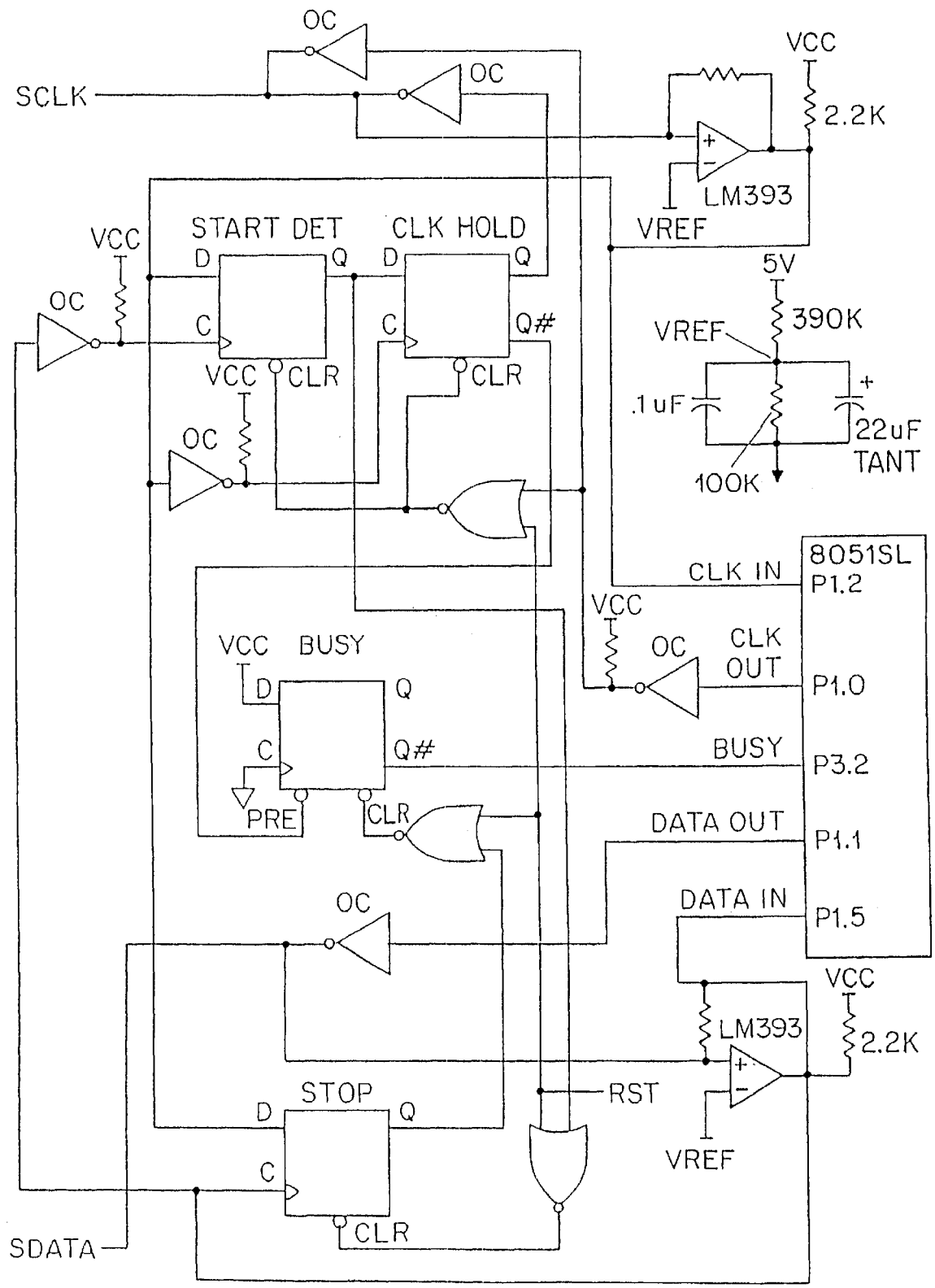
FIG. 10 shows a prior-art clock stretching circuit.

FIG. 9 shows in schematic form a clock stretching circuit employing four bipolar transistors 210, 212, 214, 213. Its theory of operation is largely in correspondence to the theory of operation of the system of FIG. 4.

I claim:

1. For use with a synchronous bus having a clock line with a first quiescent level and a second active level and a data line, and with a bus device having higher and lower power-consuming states; a clock stretcher comprising first and second analog switches each having a control, said first analog switch controlled by said clock line, an output of the first analog switch being open when said clock line is at its first level and being at a predetermined level for a predetermined interval when said clock line is at its second level; said output of said first analog switch when at its predetermined level causing said bus device to transition from its lower-power-consuming-state to its higher-power-consuming state; said output of said first analog switch when at its predetermined level controlling said second analog switch to maintain said clock line to said second level; said bus device further characterized in having a control output, said control output operatively coupled with said second analog switch so that upon assertion thereof said second analog switch ceases maintaining said clock line to said second level.

2. The apparatus of claim 1 wherein the output causing said bus device to transition from its lower-power-consuming-state to its higher-power-consuming state is connected to said bus device via the same conductor as the control output of the bus device.

3. The apparatus of claim 1 further comprising a metal-oxide-semiconductor field-effect transistor with a gate, source and drain, said gate connected to a predetermined potential, one of said source and drain connected to the bus clock line; the other of said source and drain connected to the clock stretcher and bus device and connected via a high-value pullup resistor to said predetermined potential.

4. For use with a synchronous bus having a clock line with a first quiescent level and a second active level and a data line, and with a bus device having higher and lower power-consuming states; a clock stretcher comprising first and second four-position analog switches, both of said switches controlled by a two-input binary control defining first and second inputs, said clock line comprising said first one of said binary inputs, an output of the first analog switch being open when said clock line is at its first level and being at said second active level when said first input is at said second active level and said second input is at a predetermined level; said output of said first analog switch connected with said clock line; said output of said first analog switch when at said second active level causing said bus device to transition from its lower-power-consuming-state to its higher-power-consuming state; said bus device further characterized in having a control output; said second four-position analog switch characterized in that when said first input is at said second active level and said second input is at said predetermined level, said control output is connected with said second input.

5. The apparatus of claim 4 wherein the output causing said bus device to transition from its lower-power-consuming-state to its higher-power-consuming state is connected to said bus device via a different conductor from that of the control output of the bus device.

6. The apparatus of claim 4 further comprising a metal-oxide-semiconductor field-effect transistor with a gate, source and drain, said gate connected to a predetermined potential, one of said source and drain connected to the bus clock line; the other of said source and drain connected to the clock stretcher and bus device and connected via a high-value pullup resistor to said predetermined potential.

7. For use with a synchronous bus having a clock line with a first quiescent level and a second active level and a data line, and with a bus device having higher and lower power-consuming states; a clock stretcher comprising first and second transistors, said first and second transistors defining a bistable gate having first and second states; said gate electrically coupled with said clock line; said gate characterized in that transition of said clock line to said second active level causes said gate to enter said second state; said gate in said second state drawing said clock line to said second active level and in said first state not drawing said clock line to said second active level; said bus device responsive to said clock line entering said second active level by entering said higher power-consuming state, and further characterized in having a control output; said gate responsive to said control output by leaving said second state and entering said first state.

8. The apparatus of claim 7 further comprising a metal-oxide-semiconductor field-effect transistor with a gate, source and drain, said gate connected to a predetermined potential, one of said source and drain connected to the bus clock line; the other of said source and drain connected to the clock stretcher and bus device and connected via a high-value pullup resistor to said predetermined potential.

9. For use with a synchronous bus having a clock line with a first quiescent level and a second active level and a data line, and with a bus device having higher and lower power-consuming states; a clock stretcher comprising a transistor and a flip-flop having first and second states; said flip-flop in said second state coupled with said transistor to turn on said transistor and in said first state not turning on said transistor; said flip-flop responsive to said clock line entering said second active level by entering said second state; said transistor when turned on drawing said clock line toward said second active level; said bus device communicatively coupled with said flip-flop and responsive to the state of said flip-flop by entering its higher power-consuming state in response to said flip-flop entering said second state; said bus device further characterized in having a control output; said flip-flop responsive to said control output by leaving said second state and entering said first state.

10. The apparatus of claim 9 wherein the communicative coupling causing said bus device to transition from its lower-power-consuming-state to its higher-power-consuming state is connected with said bus device via a different conductor from that of the control output of the bus device.

11. The apparatus of claim 9 further comprising a metal-oxide-semiconductor field-effect transistor with a gate, source and drain, said gate connected to a predetermined potential, one of said source and drain connected to the bus clock line; the other of said source and drain connected to the clock stretcher and bus device and connected via a high-value pullup resistor to said predetermined potential.

12. A system comprising a synchronous bus having a clock line with a first quiescent level and a second active level and a data line, and with a bus device coupled to the bus;

a level shifter comprising a metal-oxide-semiconductor field-effect transistor with a gate, source and drain, said gate connected to a predetermined potential differing from the second active level, one of said source and drain connected to the bus clock line; the other of said source and drain connected to the bus device and connected via a high-value pullup resistor to said predetermined potential.

* * * * *

UNITED STATES PATENT AND TRADEMARK OFFICE
CERTIFICATE OF CORRECTION

PATENT NO.         : 6,239,644 B1                              Page 1 of 1
APPLICATION NO.    : 09/445191
DATED              : May 29, 2001
INVENTOR(S)        : Victor Marten, Ioannis Milios and Wei Wang It is certified that error appears in the above-identified patent and that said Letters Patent is hereby corrected as shown below:

On the Title page,

Item [74], "Oppendahl" should read -- Oppedahl --

Signed and Sealed this

Eighteenth Day of May, 2010

David J. Kappos
*Director of the United States Patent and Trademark Office*